United States Patent
Nakaoka

(10) Patent No.: US 10,679,692 B2
(45) Date of Patent: Jun. 9, 2020

(54) MEMORY APPARATUS AND MAJORITY DETECTOR THEREOF

(71) Applicant: Winbond Electronics Corp., Taichung (TW)

(72) Inventor: Yuji Nakaoka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/417,674

(22) Filed: May 21, 2019

(65) Prior Publication Data

US 2019/0362768 A1 Nov. 28, 2019

(30) Foreign Application Priority Data

May 25, 2018 (JP) .................................. 2018-100101

(51) Int. Cl.
*G11C 11/4093* (2006.01)
*H03K 19/23* (2006.01)
*G11C 11/4091* (2006.01)

(52) U.S. Cl.
CPC ...... *G11C 11/4093* (2013.01); *G11C 11/4091* (2013.01); *H03K 19/23* (2013.01)

(58) Field of Classification Search
CPC .. G11C 11/4093; G11C 11/4091; H03K 19/23
USPC .................................................... 365/189.11
See application file for complete search history.

(56) References Cited

U.S. PATENT DOCUMENTS

| | | | |
|---|---|---|---|
| 5,446,686 A * | 8/1995 | Bosnyak | G11C 15/00 365/189.07 |
| 5,838,166 A | 11/1998 | Nakamura | |
| 6,584,572 B1 | 6/2003 | Choi | |
| 7,701,368 B2 | 4/2010 | Hollis | |

(Continued)

FOREIGN PATENT DOCUMENTS

| | | |
|---|---|---|
| CN | 107077446 | 8/2017 |
| JP | H1093424 | 4/1998 |

(Continued)

OTHER PUBLICATIONS

"Office Action of Korea Counterpart Application," with English translation thereof, dated Dec. 13, 2019, p. 1-p. 12.

*Primary Examiner* — Fernando Hidalgo
(74) *Attorney, Agent, or Firm* — JCIPRNET

(57) ABSTRACT

A memory apparatus and a majority detector thereof are provided. The majority detector includes a pull-up circuit, a first switch, a second switch, a plurality of first transistors, a plurality of second transistors and a sense amplifying circuit. The pull-up circuit provides a first voltage to a first node and a second node according to a control signal before a sensing period. The first switch and the second switch provide a second voltage to the first node and the second node respectively according to the control signal during the sensing period. Control ends of the first transistors each receives one of a plurality of values of a data signal. Control ends of the second transistors each receives an inverse value of the one of the values of the data signal. The sense amplifying circuit generates a sensing result according to a voltage difference between the first node and the second node during the sensing period, and the sensing result indicates a majority value among the values.

20 Claims, 6 Drawing Sheets

(56) References Cited

U.S. PATENT DOCUMENTS

| | | | |
|---|---|---|---|
| 10,262,720 B2* | 4/2019 | Nii | G11C 15/04 |
| 2003/0103405 A1 | 6/2003 | Mano et al. | |
| 2003/0227403 A1 | 12/2003 | Nakagawa et al. | |
| 2007/0115733 A1 | 5/2007 | Jang et al. | |
| 2007/0121360 A1 | 5/2007 | Lee | |
| 2009/0274245 A1 | 11/2009 | Brown et al. | |
| 2014/0298146 A1 | 10/2014 | Brown et al. | |

FOREIGN PATENT DOCUMENTS

| | | |
|---|---|---|
| JP | 2000099218 | 4/2000 |
| JP | 2004015434 | 1/2004 |
| KR | 100205555 | 7/1999 |
| TW | 200811874 | 3/2008 |
| TW | I343058 | 6/2011 |
| TW | 201443651 | 11/2014 |

\* cited by examiner

MEMORY APPARATUS AND MAJORITY DETECTOR THEREOF

CROSS-REFERENCE TO RELATED APPLICATION

This application claims the priority benefit of Japan application serial no. 2018-100101, filed on May 25, 2018. The entirety of the above-mentioned patent application is hereby incorporated by reference herein and made a part of this specification.

BACKGROUND OF THE DISCLOSURE

Field of the Disclosure

The disclosure relates to a memory apparatus and a majority detector thereof, and particularly relates to a memory apparatus having a data bus inversion (DBI) function and a majority detector thereof.

Description of Related Art

In the technical field of dynamic memory, an interface for transmitting data signals is terminated to a reference ground voltage. Therefore, the more bits at a logic high level in the transmitted data signal, the greater the power consumption being generated. In order to reduce the power consumption, a conventional dynamic memory adopts data bus inversion (DBI) technology, so that the logic level of each bit of the data signal is inverted for transmission when bits at the logic high level are in the majority (e.g., when more than half of the eight values in a byte are "1").

In terms of the action of determining whether the bits at the logic high level are in the majority, conventional majority detectors often require more transistors. As a result, conventional majority detectors occupy a larger layout area, the power consumption of the memory apparatus adopting the conventional majority detectors is increased, the performance efficiency is reduced, and the production cost is increased. Therefore, how to reduce the power consumption, the required number of transistors and the layout area of the majority detector is an important issue for designers in this field.

SUMMARY OF THE DISCLOSURE

The disclosure provides a memory apparatus and a majority detector thereof for indicating a majority value in a data signal. A data bus inverter circuit of the memory apparatus outputs an inversion data signal according to a sensing result generated by the majority detector.

The majority detector in the disclosure includes a pull-up circuit, a first switch, a second switch, a plurality of first transistors, a plurality of second transistors and a sense amplifying circuit. The pull-up circuit is configured to provide a first voltage to a first node and a second node according to a control signal before a sensing period. The first switch is coupled between a second voltage and the first node, and is configured to provide the second voltage to the first node according to the control signal during the sensing period, and the second voltage is greater than the first voltage. The second switch is coupled between the second voltage and the second node, and is configured to provide the second voltage to the second node according to the control signal during the sensing period. The plurality of first transistors are coupled between the first node and a third node. Control ends of the plurality of first transistors each receive one of a plurality of values of a data signal. The third node is coupled to a third voltage during the sensing period, and the third voltage is less than the first voltage. The plurality of second transistors are coupled between the second node and the third node. Control ends of the plurality of second transistors each receive an inverse value of the one of the plurality of values. The sense amplifying circuit is coupled to the first node and the second node, and generates a sensing result according to a voltage difference between the first node and the second node during the sensing period. Also, the sensing result indicates a majority value among the plurality of values.

The memory apparatus of the disclosure includes a plurality of majority detectors as described above and a data bus inverter circuit. The data bus inverter circuit outputs an inversion data signal composed of inverse values of the plurality of values according to the sensing result generated by the plurality of majority detectors.

Based on the foregoing, the majority detector proposed by the disclosure includes the plurality of first transistors coupled between the first node and the third node and includes the plurality of second transistors coupled between the second node and the third node. Through the pull-up circuit, the first node and the second node are pulled up to the first voltage that is less than the second voltage before the sensing period. During the sensing period, the first node and the second node are coupled to the second voltage, and the third node is coupled to the third voltage that is less than the first voltage. Then, through the sense amplifying circuit, the sensing result is generated according to the voltage difference between the first node and the second node. In this way, without the use of a large number of transistors, the power consumption required by the majority detector may be reduced, and the sensing speed of the majority detector may be increased to effectively improve the performance efficiency of the memory apparatus.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
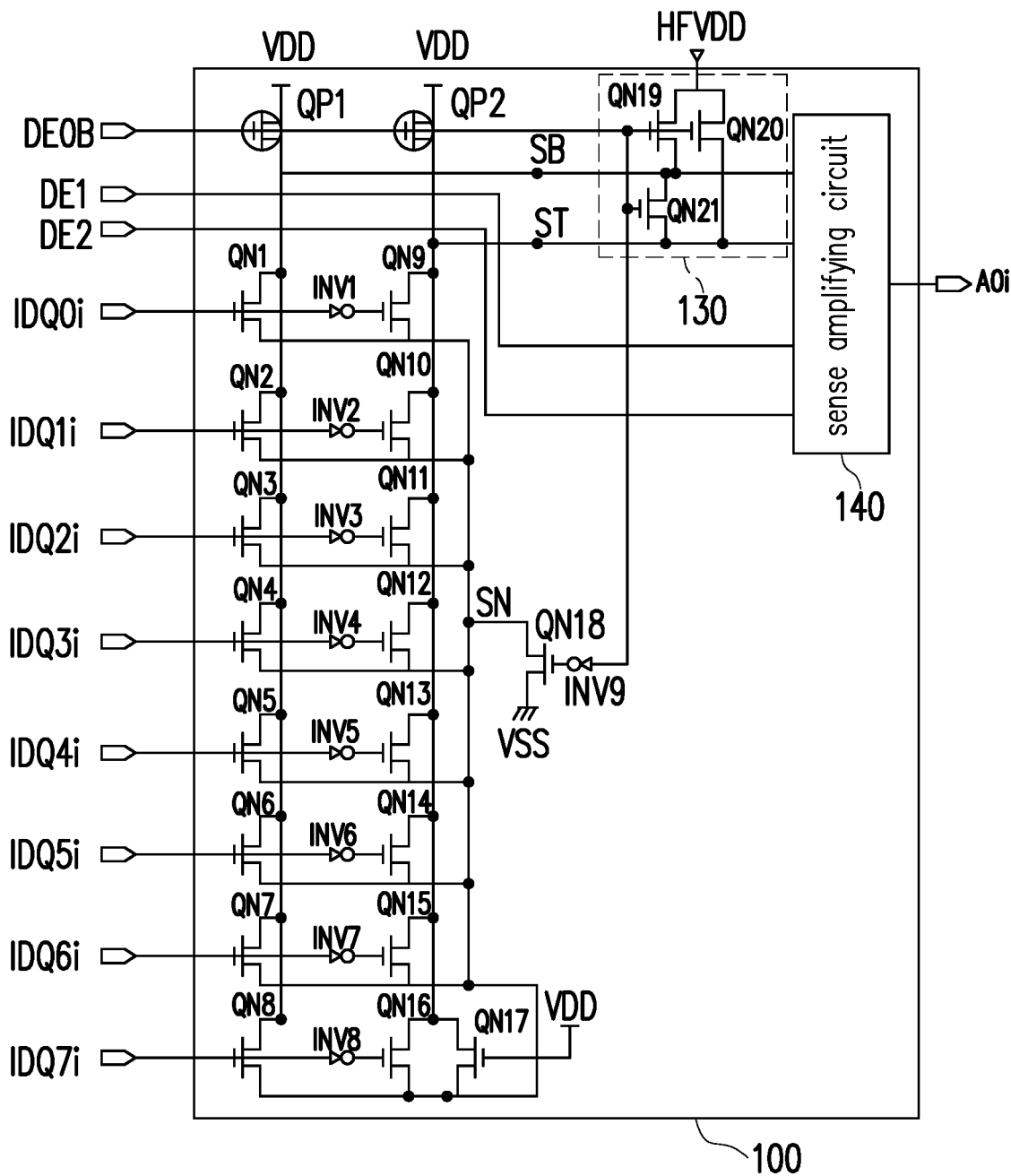
FIG. 1 is a schematic view showing a majority detector according to an embodiment of the disclosure.

FIG. 1 is a schematic view showing a majority detector according to an embodiment of the disclosure. With reference to FIG. 1, a majority detector 100 is disposed in a memory apparatus having a data bus inverter circuit, and is adapted to provide a sensing result to the data bus inverter circuit. Herein the memory apparatus may be a dynamic random access memory apparatus, e.g., a low power double-data-rate fourth generation synchronous dynamic random access memory (LPDDR4 SDRAM). The majority detector 100 includes first transistors QN1~QN8, inverters INV1~INV8, second transistors QN9~QN16, a pull-up circuit 130, a sense amplifying circuit 140, a first switch QP1, a second switch QP2, a third switch QN18 and a third transistor QN17. The first transistors QN1~QN8 have first ends commonly coupled to a first node SB, second ends commonly coupled to a third node SN, and control ends each receives one of a plurality of values IDQ0$i$~IDQ7$i$ of a data signal IDQji. Besides, the second transistors QN9~QN16 has first ends commonly coupled to a second node ST, second ends commonly coupled to the third node SN, and control ends respectively coupled to output ends of the inverters INV1~INV8. Input ends of the inverters INV1~INV8 receive the plurality of values IDQ0$i$~IDQ7$i$ of the data signal IDQji, and the output ends of the inverters INV1~INV8 generate inverse values of the values IDQ0$i$~IDQ7$i$.

The number of the first transistors QN1~QN8 being turned on may be determined according to the number of logic high level values (1) among the values IDQ0$i$~IDQ7$i$, so that an equivalent impedance between the third node SN and the first node SB may be further determined. Similarly, the number of the second transistors QN9~QN16 being turned on may be determined according to the number of logic low level values (0) among the values IDQ0$i$~IDQ7$i$, so that an equivalent impedance between the third node SN and the second node ST may be further determined.

The pull-up circuit 130 is configured to pull up a voltage on the first node SB and the second node ST to a first voltage according to a control signal DE0B before a sensing period. The first switch QP1 is coupled between a second voltage and the first node SB, and the second switch QP2 is coupled between the second voltage and the second node ST. The first switch QP1 and the second switch QP2 are configured to be turned on at the same time according to the control signal DE0B during the sensing period, so that the voltage on the first node SB and the second node ST is pulled up from the first voltage to the second voltage. The first voltage is less than the second voltage. In an embodiment of the disclosure, the first voltage may be half of the second voltage. The second voltage may be an operating voltage VDD, and the first voltage may be half of the operating voltage VDD, that is, HFVDD. In the disclosure, through the pull-up circuit 130, the time required for pulling up to the second voltage during the sensing period may be reduced, so that the sensing speed may be increased. Moreover, since the first node SB and the second node ST only need to be maintained at the first voltage during a non-sensing period, power consumption of the memory apparatus may be reduced.

The pull-up circuit 130 includes transistors QN19~QN21 which have control ends all receiving the control signal DE0B. The transistor QN19 is connected between the first node SB and the first voltage, the transistor QN20 is connected between the second node ST and the first voltage, and the transistor QN21 is connected between the first node SB and the second node ST.

The transistors QN19~QN21 are all N-type transistors, and the first switch QP1 and the second switch QP2 are both P-type transistors. Based on the fact that the transistors QN19~QN21, the first switch QP1 and the second switch QP2 are controlled by the same control signal DE0B, when the transistors QN19~QN21 are turned on, the first switch QP1 and the second switch QP2 are turned off. In contrast, when the transistors QN19~QN21 are turned off, the first switch QP1 and the second switch QP2 are turned on. Accordingly, the voltage pull-up operations of the first switch QP1 and the second switch QP2 and the voltage pull-up operation of the pull-up circuit 130 do not occur at the same time.

The sense amplifying circuit 140 is coupled to the first node SB and the second node ST, and generates a sensing result A0$i$ according to a voltage difference between the first node SB and the second node ST during the sensing period. The sensing result A0$i$ indicates a majority value among the values IDQ1$i$~IDQ7$i$. The data bus inverter circuit may receive the sensing result A0$i$, and determine whether to output an inversion data signal composed of the inverse values of the values IDQ1$i$~IDQ7$i$ according to the sensing result A0$i$. The operation time of the sense amplifying circuit 140 is determined according to enable signals DE1 and DE2.

The third switch QN18 is coupled between the third node SN and the third voltage, and is configured to be turned on during the sensing period. In one embodiment, the third switch QN18 is controlled by an inverse signal of the control signal DE0B. In this embodiment, an inverter INV9 receives the control signal DE0B, and supplies the inverse signal of the control signal DE0B to a control end of the third switch QN18. The third voltage is less than the first voltage. In this embodiment, the third voltage may be a reference ground voltage VSS.

The third transistor QN17 is connected in parallel with one of the second transistors, that is, the second transistor QN16. The first transistors QN1~QN8, the second transistors QN9~QN16 and the third transistor QN17 may all be the same N-type transistors. A control end of the third transistor QN17 receives the operating voltage VDD to be constantly turned on, and is configured to provide a bypass path coupled to the third voltage for the second transistor QN9~QN16 during the sensing period. Accordingly, when half of the values IDQ1$i$~IDQ7$i$ are at a logic high level (1), the voltage drop amplitude of the second node ST is greater than the voltage drop amplitude of the first node SB. That is, the voltage on the first node SB is higher than the voltage on the second node ST, so that the sense amplifying circuit 140 generates a sensing result A0$i$ equal to a logic low level.

In this embodiment, current driving capabilities of the transistors QN1~QN17 may be the same, and the N-type transistor that constitutes the third switch QN18 has a relatively greater current driving capability.

In an alternative embodiment (not shown) based on this embodiment, the majority detector is not provided with the third transistor QN17, and the current driving capability of the second transistor is greater than the current driving capability of the first transistor. For example, the current driving capability of the second transistor may be 1.2 times the current driving capability of the first transistor. Accordingly, when four of the values IDQ1$i$~IDQ7$i$ of the data signal are at the logic high level, the voltage on the first node SB may still be higher than the voltage on the second node ST, so that the sense amplifying circuit 140 generates a sensing result A0$i$ equal to the logic low level.

Figure 2:
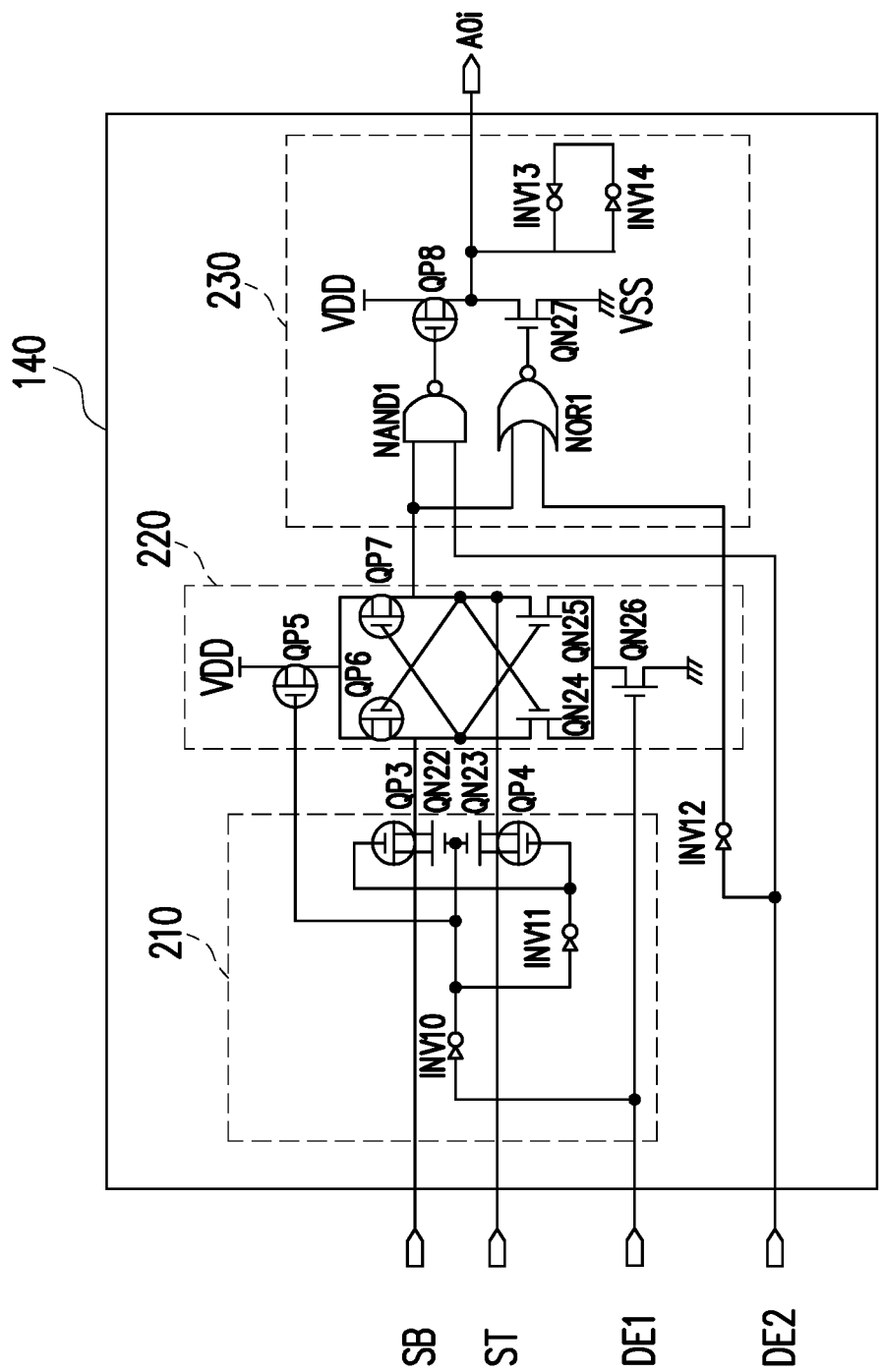
FIG. 2 is a schematic view showing a sense amplifying circuit according to an embodiment of the disclosure.

FIG. 2 is a schematic view showing a sense amplifying circuit according to an embodiment of the disclosure. The sense amplifying circuit 140 includes a transmission circuit 210, a comparing and amplifying circuit 220 and a latch circuit 230. The transmission circuit 210 includes a first transmission gate composed of transistors QP3 and QN22, a second transmission gate composed of transistors QP4 and QN23, and inverters INV10 and INV11. The inverters INV10 and INV11 are connected in series, and generate control signals of the transistors QP3, QN22, QP4 and QN23 according to the enable signal DE1. Herein the first transmission gate and the second transmission gate may be turned on or off at the same time. The first transmission gate and the second transmission gate are configured to be both turned on during the sensing period, so that the voltage on the first node SB and the second node ST may be transmitted to two input ends of the comparing and amplifying circuit 220.

The comparing and amplifying circuit 220 includes two pairs of cross-coupled transistors. Herein transistors QP6 and QP7 form a first pair of cross-coupled transistors, and transistors QN24 and QN25 form a second pair of cross-coupled transistors. The transistor QP6 is coupled between the operating voltage VDD and the first node SB, the transistor QP7 is coupled between the operating voltage VDD and the second node ST, and the transistors QP6 and QP7 receive the operating voltage VDD through a fourth switch QP5 that is turned on. The transistor QN24 is coupled between the reference ground voltage VSS and the first node SB, the transistor QN25 is coupled between the reference ground voltage VSS and the second node ST, and the transistors QN24 and QN25 are coupled to the reference ground voltage VSS through a fifth switch QN26 that is turned on.

In this embodiment, a control end of the fourth switch QP5 is coupled to an output end of the inverter INV10, so that the fourth switch QP5 is controlled by an inverse signal of the enable signal DE1, and the fifth switch QN26 is controlled by the enable signal DE1. In this way, when the enable signal DE1 is at the logic high level, the fourth switch QP5 and the fifth switch QN26 are both turned on, and the voltage difference between the first node SB and the second node ST is compared and amplified through the comparing and amplifying circuit 220 so that a sensing value is generated.

The sensing value generated by the comparing and amplifying circuit 220 is transmitted to the latch circuit 230. In this embodiment, the latch circuit 230 includes a logic circuit composed of logic gates NAND1 and NOR1, an inverter circuit composed of transistors QP8 and QN27, and a latch composed of inverters INV13 and INV14. The logic gate NAND1 is a NAND gate, receives the sensing value and the enable signal DE2, and generates an operation result to serve as a control signal of the transistor QP8. The logic gate NOR1 is a NOR gate, receives the sensing value and an inverse signal of the enable signal DE2 (generated by an inverter INV12), and generates an operation result to serve as a control signal of the transistor QN27. Through the logic circuit, when the enable signal DE2 is at the logic high level, the inverter circuit may generate a sensing result A0$i$ that is at the same logic level as the sensing value.

An input end of the inverter INV14 receives the sensing result A0$i$, an output end of the inverter INV14 is coupled to an input end of the inverter INV13, and an output end of the inverter INV13 is coupled to the input end of the inverter INV14. In this way, the sensing result A0$i$ may be effectively latched in the latch.

Figure 3:
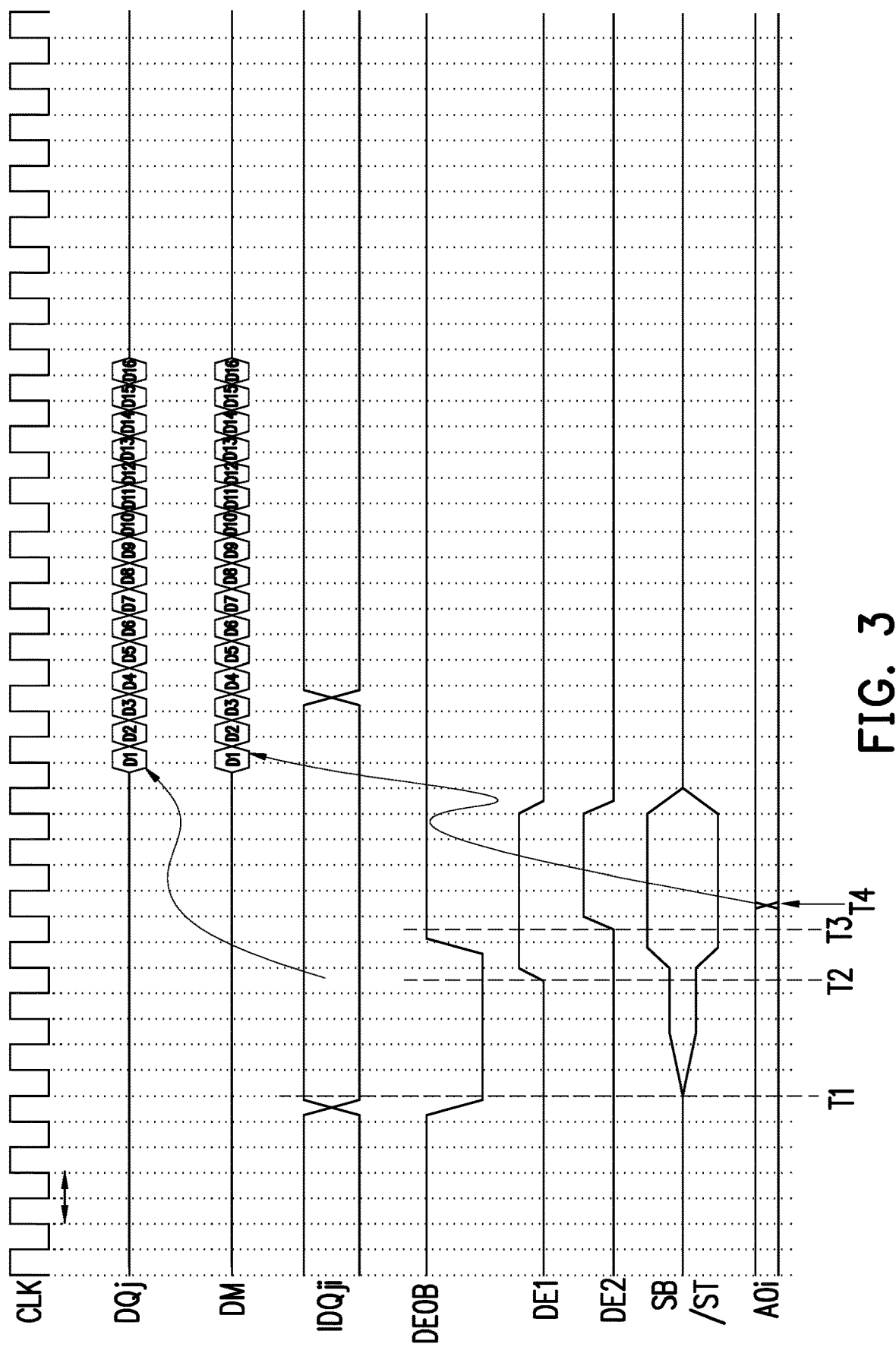
FIG. 3 is a timing diagram showing each signal of the majority detector during a reading operation period according to an embodiment of the disclosure.

Hereinafter, with reference to FIG. 1 and FIG. 3, FIG. 3 is a timing diagram showing each signal of the majority detector during a reading operation period according to an embodiment of the disclosure. In FIG. 3, a clock signal CLK is a base clock signal. A pre-charge period of the majority detector 100 is included before a time point Ti. At this moment, the control signal DE0B is at the logic high level, so that the transistors QN19~QN21 in the pull-up circuit 130 are turned on, and the first switch QP1 and the second switch QP2 are turned off. As a result, the first node SB and the second node ST are pulled up to the first voltage. At the time point T1, the majority detector 100 enters the sensing period. At this moment, the control signal DE0B is at the logic low level, so that the first switch QP1, the second switch QP2 and the third switch QN18 are turned on, and the transistors QN19~QN21 in the pull-up circuit 130 are turned off. As a result, the first node SB and the second node ST are pulled up from the first voltage to the second voltage. The plurality of values IDQ1$i$~IDQ7$i$ of the data signal IDQj$i$ are respectively transmitted to the control ends of the plurality of first transistors, and the inverse values of the values IDQ1$i$~IDQ7$i$ are respectively transmitted to the control ends of the plurality of second transistors. The number of the first transistors and the second transistors being turned on is determined according to the number of logic high level values among the values IDQ1$i$~IDQ7$i$, so that the degree to which the voltages on the first node SB and the second node ST are pulled down may be further determined. In this embodiment, when the number of logic high level values among the values IDQ1$i$~IDQ7$i$ is greater than or equal to 5, the voltage on the first node SB is lower than the voltage on the second node ST. In contrast, when the number of logic high level values among the values IDQ1$i$~IDQ7$i$ is less than 5, the voltage on the first node SB is higher than the voltage on the second node ST. At a time point T2, the enable signal DE1 is at the logic high level, and the sense amplifying circuit 140 is activated to compare and amplify the voltage difference between the first node SB and the second node ST and generate the sensing value. At a time point T3, the sense amplifying circuit 140 latches the sensing result A0$i$. At a time point T4, the sense amplifying circuit 140 outputs the sensing result A0$i$. In this embodiment, when the number of logic high level values among the values IDQ1$i$~IDQ7$i$ is greater than or equal to 5, the sensing result A0$i$ is at the logic high level. In contrast, when the number of logic high level values among the values IDQ1$i$~IDQ7$i$ is less than 5, the sensing result A0$i$ is at the logic low level.

According to the sensing result A0$i$, the memory apparatus may decide whether to activate the data bus inverter circuit so as to generate a data signal DQj for outputting. When the sensing result A0$i$ is equal to the logic high level, the data bus inverter circuit is activated to invert the values IDQ0$i$~IDQ7$i$ of the data signal IDQj$i$ so as to generate the data signal DQj for outputting. Besides, a data mask inversion signal DMI at the logic high level is also generated accordingly. In contrast, when the sensing result A0$i$ is equal to the logic low level, the data bus inverter circuit is not activated, and outputs the data signal DQj that is equal to the values IDQ0$i$~IDQ7$i$ of the data signal IDQj$i$ and generates the data mask inversion signal DMI at the logic low level.

It should be noted that since the terminal of the data transmission interface in the memory apparatus is connected to the reference ground voltage VSS, current consumption only occurs when logic high level values are output. A data signal having eight bits (values) is taken as an example in this embodiment. When five or more than five of the values in the input data signal are at the logic high level, the data bus inverter circuit in the memory apparatus is then activated, so that the inverse values of the values of the input data signal may serve as the data signal for outputting. Accordingly, the number of logic high level values in the data signal for outputting is less than half so as to reduce current consumption. At this moment, the data mask inversion signal DMI is used to notify whether the logic level of the data signal is inverted.

Figure 4:
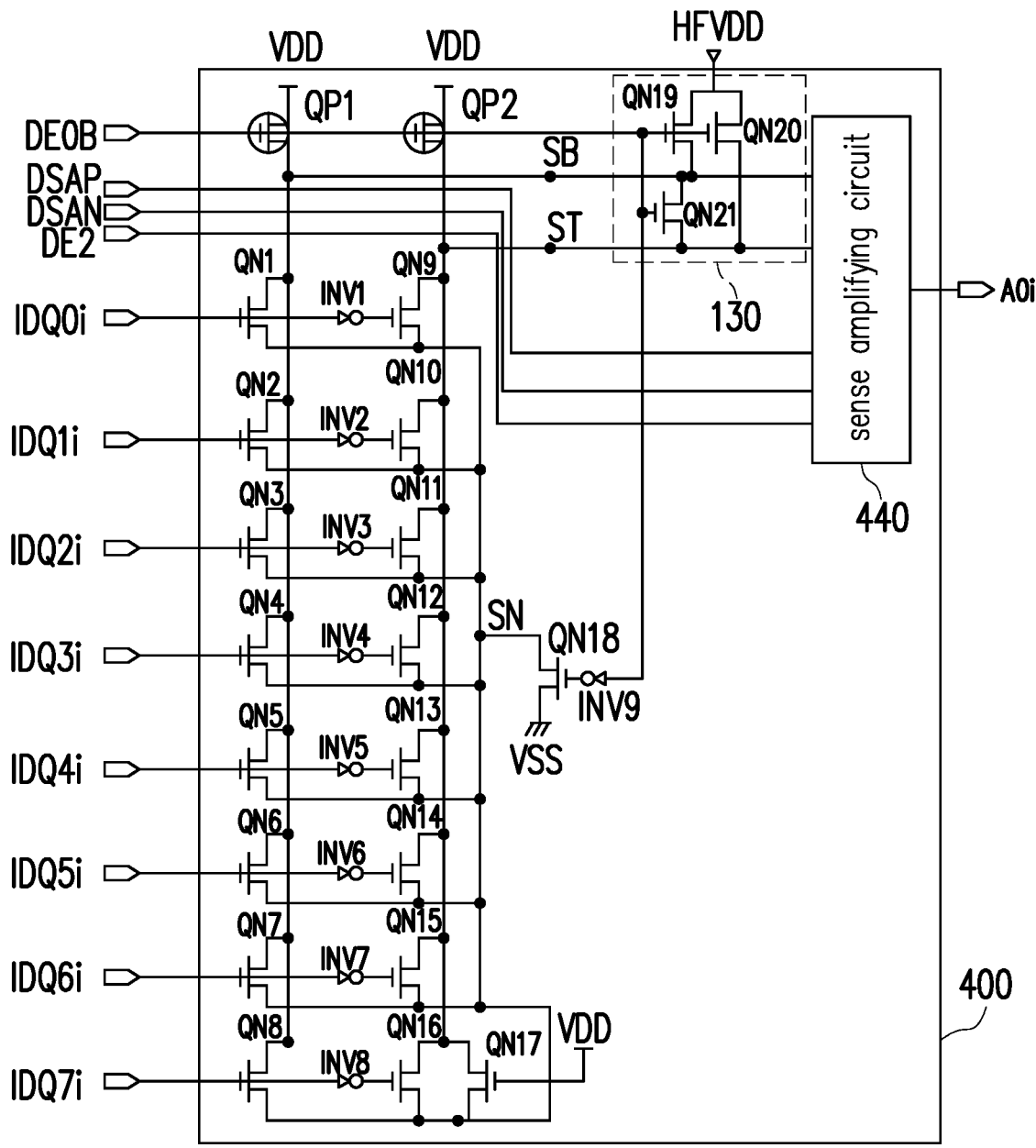
FIG. 4 is a schematic view showing a majority detector according to another embodiment of the disclosure.
Figure 6A:
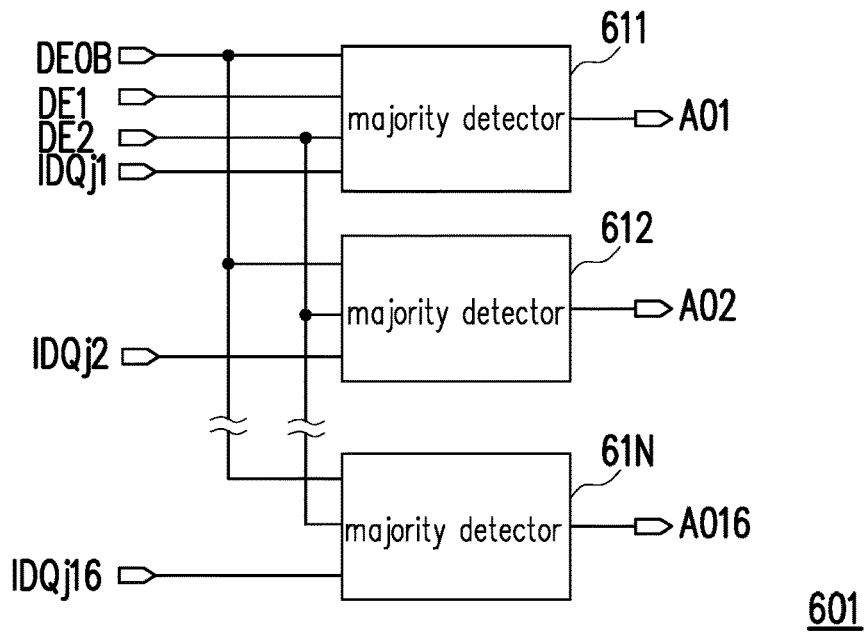
FIG. 6A and FIG. 6B are respectively schematic views showing a memory apparatus according to different embodiments of the disclosure.
Figure 6B:
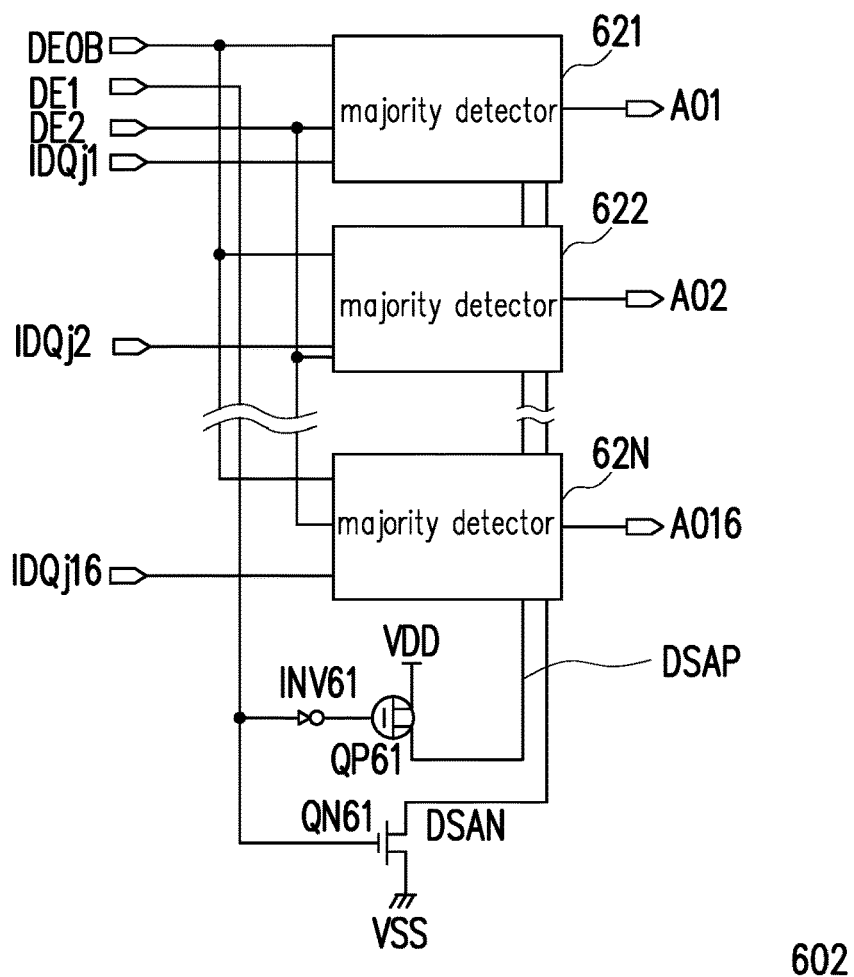

FIG. 4 is a schematic view showing a majority detector according to another embodiment of the disclosure. A majority detector 400 has the same or similar features as the majority detector 100, and detailed descriptions thereof are not repeated herein. Differences between the majority detector 400 of this embodiment and the majority detector 100 of the foregoing embodiment are described as follows. In this embodiment, a sense amplifying circuit 440 of the majority detector 400 receives enable signals DSAP, DSAN and DE2, and is activated according to the enable signals DSAP, DSAN and DE2 so as to sense a voltage difference between a first node SB and a second node ST and generate a sensing result A0$i$. As shown in FIG. 6B, the enable signals DSAP and DSAN are generated according to the enable signal DE1 in the foregoing embodiment. Corresponding to the time interval in which the enable signal DE1 is enabled, the enable signals DSAP and DSAN respectively provide an operating voltage and a reference ground voltage to the sense amplifying circuit 440, so that the sense amplifying circuit 440 may operate normally. Through such kind of configuration, it is possible to reduce the number of transistors required in the sense amplifying circuit 440 and to lower the circuit cost.

In an alternative embodiment, the transistor QN17 is omitted, and the current driving capability of the second transistors QN9~QN16 is greater than the current driving capability of the first transistors QN1~QN8. Accordingly, during a sensing period, when four of the eight values IDQ1$i$~IDQ7$i$ of the data signal are at the logic high level, the voltage on the second node ST may be slightly lower than the voltage on the first node SB, so that the sense amplifying circuit 440 generates a sensing result A0$i$ equal to the logic low level.

Figure 5:
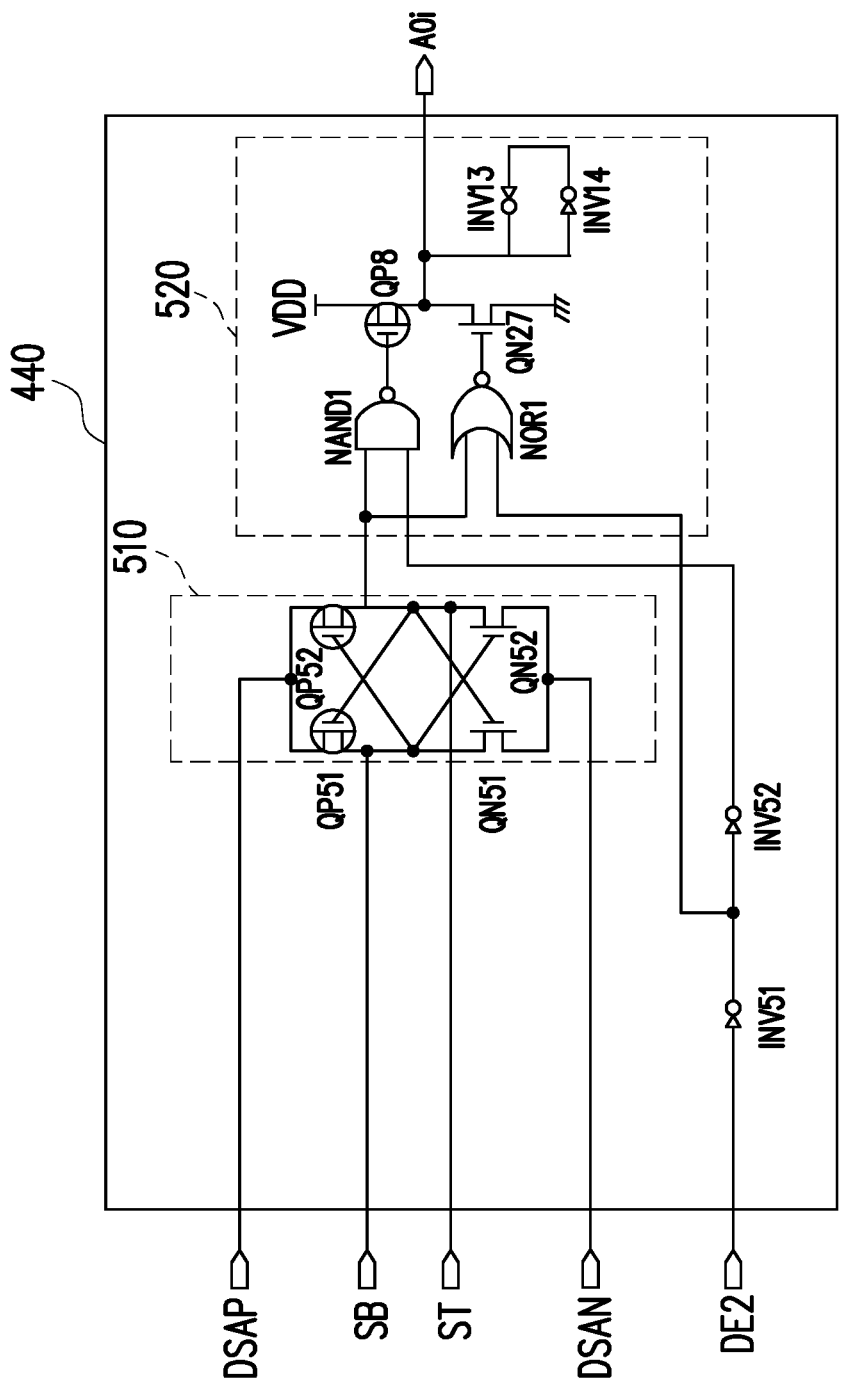
FIG. 5 is a schematic view showing the sense amplifying circuit in the embodiment of FIG. 4 of the disclosure.

Regarding the implementation details of the sense amplifying circuit 440 of FIG. 4, please refer to FIG. 5, which is a schematic view showing a sense amplifying circuit. In FIG. 5, the sense amplifying circuit 440 includes an inverter INV51, an inverter INV52, a comparing and amplifying circuit 510 and a latch circuit 520. Compared to the comparing and amplifying circuit 220 of FIG. 2, the comparing and amplifying circuit 510 includes only cross-coupled transistors QP51 and QP52 and cross-coupled transistors QN51 and QN52. The transistors QP51 and QP52 directly receive the enable signal DSAP, and the transistors QN51 and QN52 are directly coupled to the enable signal DSAN. During the sensing period, the enable signal DSAP is equal to an operating voltage VDD and the enable signal DSAN is equal to a reference ground voltage VSS, so that the comparing and amplifying circuit 510 is activated. By the way, when the comparing and amplifying circuit 510 is disabled and thus does not execute any action, at least one of the enable signals DSAP and DSAN is a high impedance signal. The latch circuit 520 is similar to the latch circuit 230 in the foregoing embodiment, and detailed descriptions thereof are not repeated herein. The inverter INV51 receives the enable signal DE2, and the inverter INV52 receives the output of the inverter INV51. A logic gate NAND1 receives the sensing value and the output of the inverter INV52, and generates an operation result to serve as a control signal of the transistor QN8.

Hereinafter, please refer to FIG. 6A and FIG. 6B. FIG. 6A and FIG. 6B are respectively schematic views showing a memory apparatus according to different embodiments of the disclosure. In FIG. 6A, a memory apparatus 601 includes a plurality of majority detectors 611~61N. The majority detectors 611~61N commonly receive enable signals DE1 and DE2 and a control signal DE0B, respectively receive data signals IDQj1~IDQj16, and respectively generate sensing results A01~A016. In this embodiment, the memory apparatus 601 may be provided with sixteen majority detectors 611~61N. When the memory apparatus 601 operates in a burst mode, it is possible to simultaneously perform determination regarding the 0,1 status of sixteen groups of 8-bit data signals.

Surely, in light of the foregoing description, the number of majority detectors provided in the memory apparatus 601 may be adjusted according to the setting of the burst mode provided by the memory apparatus 601. No limitation is particularly imposed herein.

On the other hand, the majority detectors 611~61N in the embodiment of the disclosure may be implemented according to the majority detector 100 in the embodiment as shown in FIG. 1 of the disclosure.

In FIG. 6B, a memory apparatus 602 includes majority detectors 621~62N, transistors QP61 and QN61 and an inverter INV61. The majority detectors 621~62N commonly receive enable signals DE1, DSAP, DSAN and DE2 and a control signal DE0B, respectively receive data signals IDQj1~IDQj16, and respectively generate sensing results A01~A016. In this embodiment, the transistor QP61 receives an operating voltage VDD and an inverse signal of the enable signal DE1. The transistor QP61 is turned on or off according to the inverse signal of the enable signal DE1. When the transistor QP61 is turned on, the majority detectors 621~62N receive the enable signal DSAP equal to the operating voltage VDD. The inverter INV61 receives the enable signal DE1 to output the inverse signal of the enable signal DE1 to a control end of the transistor QP61. The transistor QN61 is turned on or off according to the enable signal DE1. When the transistor QN61 is turned on, the majority detectors 621~62N are coupled to the enable signal DSAN equal to a reference ground voltage VSS.

In this embodiment, the transistor QN61 is an N-type transistor, and the transistor QP61 is a P-type transistor. Therefore, the transistors QN61 and QP61 may be turned on (or off) at the same time. When the enable signals DSAP and DSAN are respectively equal to the operating voltage VDD and the reference ground voltage VSS, the majority detectors 621~62N may be enabled to sense a voltage difference between a first node SB and a second node ST. In contrast, when the enable signals DSAP and DSAN are both in a high impedance state, the majority detectors 621~62N are disabled.

In summary, the majority detector of the disclosure includes the plurality of first transistors coupled between the first node and the third node and includes the plurality of second transistors coupled between the second node and the third node. Through the pull-up circuit, the first node and the second node are pulled up to the first voltage that is less than the second voltage before the sensing period. Accordingly, the time required to pull up the first node and the second node to the second voltage during the sensing period is reduced. During the sensing period, the third node is coupled to the third voltage that is less than the first voltage, so that the first node and the second node generate a corresponding voltage drop according to the data signal and the inversion data signal, and the majority value in the data signal is indicated by detecting the voltage difference between the first node and the second node. In this way, without the use of a large number of transistors, the power consumption required by the majority detector may be effectively reduced, and the sensing speed may be increased to improve the overall performance efficiency of the memory apparatus.

Although the embodiments are already disclosed as above, these embodiments should not be construed as limitations on the scope of the disclosure. It will be apparent to those skilled in the art that various modifications and variations can be made to the disclosed embodiments without departing from the scope or spirit of this disclosure. In view of the foregoing, it is intended that the disclosure covers modifications and variations provided that they fall within the scope of the following claims and their equivalents.

What is claimed is:

1. A majority detector, comprising:
    a pull-up circuit configured to provide a first voltage to a first node and a second node according to a control signal before a sensing period;
    a first switch coupled between a second voltage and the first node and configured to provide the second voltage to the first node according to the control signal during the sensing period, wherein the second voltage is greater than the first voltage;
    a second switch coupled between the second voltage and the second node and configured to provide the second voltage to the second node according to the control signal during the sensing period;
    a plurality of first transistors coupled between the first node and a third node, wherein control ends of the plurality of first transistors each receives one of a plurality of values of a data signal, wherein the third node is coupled to a third voltage during the sensing period, and the third voltage is less than the first voltage;
    a plurality of second transistors coupled between the second node and the third node, wherein control ends of the plurality of second transistors each receives an inverse value of the one of the plurality of values; and
    a sense amplifying circuit coupled to the first node and the second node and generating a sensing result according to a voltage difference between the first node and the second node during the sensing period, wherein the sensing result indicates a majority value among the plurality of values.

2. The majority detector as claimed in claim 1, further comprising:
    a third switch coupled between the third node and the third voltage and configured to be turned on during the sensing period,
    wherein the plurality of first transistors and the plurality of second transistors are all formed by identical N-type transistors, and a current driving capability of the third switch is greater than a current driving capability of any one of the plurality of first transistors and the plurality of second transistors.

3. The majority detector as claimed in claim 1, further comprising:
    a third transistor coupled with one of the plurality of second transistors in parallel between the second node and the third node, wherein a control end of the third transistor receives an operating voltage.

4. The majority detector as claimed in claim 3, wherein the pull-up circuit comprises:
    a fourth transistor coupled between the first voltage and the first node, wherein a control end of the fourth transistor receives the control signal;
    a fifth transistor coupled between the first voltage and the second node, wherein a control end of the fifth transistor receives the control signal; and
    a sixth transistor coupled between the first node and the second node, wherein a control end of the sixth transistor receives the control signal,
    wherein the fourth transistor, the fifth transistor and the sixth transistor are all N-type transistors, and the first switch and the second switch are P-type transistors.

5. The majority detector as claimed in claim 2, wherein the sense amplifying circuit comprises:
    a comparing and amplifying circuit comparing and amplifying the voltage difference between the first node and the second node so as to generate a sensing value; and
    a latch circuit coupled to the comparing and amplifying circuit, and receiving and latching the sensing value to generate the sensing result.

6. The majority detector as claimed in claim 5, wherein the sense amplifying circuit further comprises:
    a transmission circuit receiving a first enable signal and determining whether to transmit a voltage on the first node and the second node to the comparing and amplifying circuit according to the first enable signal.

7. The majority detector as claimed in claim 6, wherein the transmission circuit comprises:
    a first transmission gate coupled between a first end and a first input end of the comparing and amplifying circuit, and turned on or off according to the first enable signal; and
    a second transmission gate coupled between a second end and a second input end of the comparing and amplifying circuit, and turned on or off according to the first enable signal,
    wherein the first transmission gate and the second transmission gate are turned on at the same time during the sensing period, so that the voltage on the first node and the second node is transmitted to the comparing and amplifying circuit.

8. The majority detector as claimed in claim 6, wherein the comparing and amplifying circuit comprises:
    a first pair of cross-coupled transistors, wherein one of the first pair of cross-coupled transistors is coupled between an operating voltage and the first node, and the other of the first pair of cross-coupled transistors is coupled between the operating voltage and the second node; and
    a second pair of cross-coupled transistors, wherein one of the second pair of cross-coupled transistors is coupled between a reference ground voltage and the first node, and the other of the second pair of cross-coupled transistors is coupled between the reference ground voltage and the second node.

9. The majority detector as claimed in claim 8, wherein the comparing and amplifying circuit further comprises:
    a fourth switch connected in series to a path where the first pair of cross-coupled transistors are coupled to the operating voltage, and turned on or off according to the first enable signal; and
    a fifth switch connected in series to a path where the second pair of cross-coupled transistors are coupled to the reference ground voltage, and turned on or off according to the first enable signal,
    wherein the fourth switch has an identical turned-on or off state as the fifth switch.

10. The majority detector as claimed in claim 5, wherein the latch circuit comprises:
    a logic circuit coupled to the comparing and amplifying circuit, receiving the sensing value and a second enable signal, and generating an operation result;

an inverter circuit having a control end coupled to the logic circuit, receiving the operation result, and generating the sensing result; and a latch configured to be coupled to an output end of the inverter circuit to latch the sensing result.

11. The majority detector as claimed in claim 1, wherein the first voltage is half of the second voltage, the second voltage is an operating voltage, and the third voltage is a reference ground voltage.

12. The majority detector as claimed in claim 1, wherein a current driving capability of each of the plurality of second transistors is greater than a current driving capability of each of the plurality of first transistors.

13. A memory apparatus, comprising:
a plurality of majority detectors as claimed in claim 1; and
a data bus inverter circuit outputting an inversion data signal composed of inverse values of the plurality of values according to the sensing result generated by each of the plurality of majority detectors.

14. The memory apparatus as claimed in claim 13, wherein each of the plurality of majority detectors further comprises:
a third switch coupled between the third node and the third voltage and configured to be turned on during the sensing period,
wherein the plurality of first transistors and the plurality of second transistors are all formed by identical N-type transistors, and a current driving capability of the third switch is greater than a current driving capability of any one of the plurality of first transistors and the plurality of second transistors.

15. The memory apparatus as claimed in claim 13, wherein each of the plurality of majority detectors further comprises:
a third transistor coupled with one of the plurality of second transistors in parallel between the second node and the third node, wherein a control end of the third transistor receives an operating voltage.

16. The memory apparatus as claimed in claim 15, wherein the pull-up circuit comprises:
a fourth transistor coupled between the first voltage and the first node, wherein a control end of the fourth transistor receives the control signal;
a fifth transistor coupled between the first voltage and the second node, wherein a control end of the fifth transistor receives the control signal; and
a sixth transistor coupled between the first node and the second node, wherein a control end of the sixth transistor receives the control signal,
wherein the fourth transistor, the fifth transistor and the sixth transistor are all N-type transistors, and the first switch and the second switch are P-type transistors.

17. The memory apparatus as claimed in claim 14, wherein the sense amplifying circuit comprises:
a comparing and amplifying circuit comparing and amplifying the voltage difference between the first node and the second node so as to generate a sensing value;
a latch circuit coupled to the comparing and amplifying circuit, and receiving and latching the sensing value to generate the sensing result; and
a transmission circuit receiving a first enable signal and determining whether to transmit a voltage on the first node and the second node to the comparing and amplifying circuit according to the first enable signal,
wherein the transmission circuit comprises:

a first transmission gate coupled between a first end and a first input end of the comparing and amplifying circuit, and turned on or off according to the first enable signal; and
a second transmission gate coupled between a second end and a second input end of the comparing and amplifying circuit, and turned on or off according to the first enable signal,
wherein the first transmission gate and the second transmission gate are turned on at the same time during the sensing period, so that the voltage on the first node and the second node is transmitted to the comparing and amplifying circuit.

18. The memory apparatus as claimed in claim 14, wherein the sense amplifying circuit comprises:
a comparing and amplifying circuit comparing and amplifying the voltage difference between the first node and the second node so as to generate a sensing value;
a latch circuit coupled to the comparing and amplifying circuit, and receiving and latching the sensing value to generate the sensing result; and
a transmission circuit receiving a first enable signal and determining whether to transmit a voltage on the first node and the second node to the comparing and amplifying circuit according to the first enable signal,
wherein the comparing and amplifying circuit comprises:
a first pair of cross-coupled transistors, wherein one of the first pair of cross-coupled transistors is coupled between an operating voltage and the first node, and the other of the first pair of cross-coupled transistors is coupled between the operating voltage and the second node;
a second pair of cross-coupled transistors, wherein one of the second pair of cross-coupled transistors is coupled between a reference ground voltage and the first node, and the other of the second pair of cross-coupled transistors is coupled between the reference ground voltage and the second node;
a fourth switch connected in series to a path where the first pair of cross-coupled transistors are coupled to the operating voltage, and turned on or off according to the first enable signal; and
a fifth switch connected in series to a path where the second pair of cross-coupled transistors are coupled to the reference ground voltage, and turned on or off according to the first enable signal,
wherein the fourth switch has an identical turned-on or off state as the fifth switch.

19. The memory apparatus as claimed in claim 14, wherein the sense amplifying circuit comprises:
a comparing and amplifying circuit comparing and amplifying the voltage difference between the first node and the second node so as to generate a sensing value; and
a latch circuit coupled to the comparing and amplifying circuit, and receiving and latching the sensing value to generate the sensing result;
wherein the latch circuit comprises:
a logic circuit coupled to the comparing and amplifying circuit, receiving the sensing value and a second enable signal, and generating an operation result;
an inverter circuit having a control end coupled to the logic circuit, receiving the operation result, and generating the sensing result; and
a latch configured to be coupled to an output end of the inverter circuit to latch the sensing result.

20. The memory apparatus as claimed in claim 13, wherein a current driving capability of each of the plurality of second transistors is greater than a current driving capability of each of the plurality of first transistors.

\* \* \* \* \*